(12) United States Patent
Sharma et al.

(10) Patent No.: US 7,625,674 B2
(45) Date of Patent: Dec. 1, 2009

(54) SWITCHABLE HOLOGRAPHIC GRATINGS

(75) Inventors: Suresh C. Sharma, Arlington, TX (US); Robert A. Ramsey, Fort Worth, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 11 days.

(21) Appl. No.: 10/958,669

(22) Filed: Oct. 4, 2004

(65) Prior Publication Data

US 2006/0073393 A1 Apr. 6, 2006

(51) Int. Cl.
*G03H 1/02* (2006.01)
(52) U.S. Cl. .................. 430/2; 430/1; 430/280.1; 430/945; 359/3; 359/35
(58) Field of Classification Search ............... None
See application file for complete search history.

(56) References Cited

U.S. PATENT DOCUMENTS

| | | | | |
|---|---|---|---|---|
| 4,066,334 A | * | 1/1978 | Fray et al. | 349/200 |
| 4,691,045 A | * | 9/1987 | Fukuchi et al. | 560/185 |
| 4,728,547 A | * | 3/1988 | Vaz et al. | 349/16 |
| 5,942,157 A | * | 8/1999 | Sutherland et al. | 252/582 |
| 6,398,981 B1 | * | 6/2002 | Galstian et al. | 252/299.01 |
| 2001/0008168 A1 | * | 7/2001 | Loza et al. | 156/278 |
| 2003/0213550 A1 | * | 11/2003 | Daems et al. | 156/250 |

FOREIGN PATENT DOCUMENTS

JP 05-100211 * 4/1993
JP 10-319237 * 12/1998

OTHER PUBLICATIONS

Product Bulletin: CN135 (sartomer, one page) available in the internet on May 5, 2003.*
Sutherland et al. "development of phtopolymer-liquid crystal composite materials for dynamic hologram applications", Proc. SPIE 2152 pp. 303-313 (1994).*
Jenney, "Holographic recording with photopolymers", JOSA vol. 60(9) pp. 1155-1161 (Sep. 1970).*
Zhao et al. "Novel type of red sensitive photo-polymer system for optical storage", Proc. SPEI vol. 3468 pp. 317-321 (Jul. 1998).*

(Continued)

*Primary Examiner*—Martin J Angebranndt
(74) *Attorney, Agent, or Firm*—Edwin S. Flores; Chainey P. Singleton; Chalker Flores, LLP

(57) ABSTRACT

The present invention includes systems and compositions of holographic grating structures devices and methods for fabricating such holographic grating structures. The method comprises the steps of preparing a composite mixture comprising a polymerizable matrix, a liquid crystal, and a photooxidant dye, producing an interference pattern from two interference beams, wherein the two interference beams originate from a recording laser beam directed by a low energy laser, and projecting the interference pattern on the composite mixture to form a holographic grating structure. As described, the holographic grating structure yields a first-order diffraction efficiency of at least about 30% diffraction efficiency which may be adjusted by the application of an electric field.

41 Claims, 5 Drawing Sheets

OTHER PUBLICATIONS

Close et al. "Hologram recording on photopolymer materials", Appl. Phys. Lett., vol. 14(5) pp. 159-160 (Mar. 1969).*

Sartomer product information—Application Bulletin, (9 pages, Jul. 2006).*

Margerum et al. "photopolymerization Mechanisms. I . . . ", J. Phys. Chem., vol. 75(20) pp. 3066-3074 (1971).*

Margerum et al. "photopolymerization Mechanisms. I . . . ", J. Phys. Chem., vol. 77(23) pp. 2720-2725 (1973).*

Bunning et al., "Morphology of anisotropic polymer dispersed liquid crystals and the effect of monomer functionality", J. poly. Sci., Pt. B., vol. 35 pp. 2825-2833 (1997).*

Robert A. Ramsey, et al, Switchable holographic gratings formed in polymer-dispersed liquid-crystal cells by use of a He-Ne laser, Optics Letters, vol. 30, pp. 594, No. 6, Mar. 15, 2005.

Mojca Jazbinsek, et al, Characterization of holographic polymer dispersed liquid crystal transmission gratings, Journal of Applied Physics, vol. 90, No. 8, pp. 3831-3837, Oct. 15, 2001.

Andy Y.-G. Fuh, et al, Electrically Switchable spatial filter based on polymer-dispersed liquid crystal film, Journal of Applied Physics, vol. 96, No. 10, pp. 5402-5404, Nov. 15, 2004.

A Mazzulla, P. Pagliusi, et al, Surface relief gratings on polymer dispersed liquid crystals by polarization holography, Applied Physics Letters, vol. 85, No. 13, pp. 2505-2507, Sep. 27, 2004.

D.E. Lucchetta, et al, Liqht amplification by dye-doped holographic polymer dispersed liquid crystals, Applied Physics Letters, vol. 84, No. 24, pp. 4893-4895, Jun. 14, 2004.

D. Cupelli, et al, Fine adjustment of conductivity in polymer-dispersed liquid crystals, Applied Physics Letters, vol. 85, No. 15, pp. 3292-3294, Oct. 11, 2004.

Yi-Hsin Lin, et al, High contrast polymer-dispersed liquid crystal in a 90° twisted cell, Applied Physics Letters, vol. 84, No. 20, pp. 4083-4085, May 17, 2004.

V.P. Dick, et al, Optical phase shift by polymer dispersed liquid crystal films with fine droplets, Journal of Physics D: Applied Physics, 37 (2004) 1834-1840, Jun. 16, 2004.

Praveen Malik, et al, Droplet orientation and optical properties of polymer dispersed liquid crystal composite films, Optical Materials 27 (2004) 613-617.

Jun Qi, et al, Holographically formed polymer dispersed liquid crystal displays, www.sciencedirect.com, Displays xx (2004) 1-10.

J. Klosterman, et al, The influence of surfactant in reflective HPDLC gratings, www.wciencedirect.com, Polymer 45 (2004) 7213-7218.

Scott A. Holmstrom, et al, Mechanical tuning of holographic polymer-dispersed liquid crystal reflection gratings, Allied Physics Letters, vol. 85, No. 11, pp. 1949-1951, Sep. 13, 2004.

D.E. Lucchetta, et al, Optical characterization of polymer dispersed liquid crystals for holographic recording, Journal of Applied Physics, vol. 93, No. 12, pp. 9669-9674, Jun. 15, 2003.

Guang S. He, a), et al, Tunable two-photon pumped lasing using a holographic polymer-dispersed liquid-crystal grating as a distributed feedback element.

R.M. Henry, et al, Effects of Crosslinking Agent, Cure Temperature, and UV Flux on the Electro-optical Properties of Polymer-Dispersed Liquid Crystal Cells, Journal of Polymer Science: Part B: Polymer Physics, vol. 42, pp. 404-410, (2004).

Karolina P. Fritz, et al, Alignment of Conjugated Polymers in a Nematic Liquid-Crystal Host, J. Phys., Chem. B 2003, 107, pp. 10141-10147, Aug. 23, 2003.

Lalgudi V. Natarajan, et al, Switchable Holographic Polymer-Dispersed Liquid Crystal Reflection Gratings Based on Thiol-Ene Photopolymerization, Chem. Mater. 2003, 15, pp. 2477-2484, May 21, 2003.

Richard L. Sutherland, et al, Polarization and switching properties of holographic polymer-dispersed liquid-crystal gratings, II. Experimental investigations, J. Opt. Soc. Am. B/vol. 19, No. 12, pp. 3004-3012, Dec. 2002.

Jian Zhou, et al, Conrol of the Anchoring Behavior of Polymer-Dispersed Liquid Crystals: Effect of Branching in the Side Chains of Polyacrylates, J. Am. Chem. Soc. 2002, 124, pp. 9980-9981, Aug. 7, 2002.

Jeffrey G. Winiarz, et al, Photorefractive inorganic-organic polymner-dispersed liquid-crystal nanocomposite photosensitized with cadmium sulfide quantum dots, Optics Letters, vol. 27, No. 15, pp. 1330-1332, Aug. 1, 2002.

Hans T.A. Wilderbeek, et al, Photo-Initiated Polymerization of Liquid Crystalline Thiol-Ene Monomers in Isotropic and Anisotropic Solvents, J. Phys. Chem. B 2002, 106, pp. 12874-12883, Nov. 23, 2002.

Chris C. Bowley, Variable-wavelength switchable Bragg gratings formed in polymer-dispersed liquid crystals, Applies Physics Letters, vol. 79, No. 1, pp. 9-11, Jul. 2, 2001.

Wei Lee, Observation of self-diffraction by gratings in nematic liquid crystals doped with carbon nanotubes, Optics Letters, vol. 26, No. 8, pp. 521-523, Apr. 15, 2001.

R.L. Sutherland, Periodic Polymer-Dispersed Liquid Crystal Structures, Mol. Cryst. and Liq. Cryst., 2001, vol. 358, pp. 22-35.

T.J. Bunning, Holographic Polymer-Dispersed Liquid Crystals (H-PDLCs), Annu. Rev. Mater. Sci., 2000, 30:83-115.

C.C. Bowley, et al, Diffusion kinetics of formation of holographic polymer-dispersed liquid crystal display materials, Applied Physics Letter, vol. 76, No. 16, pp. 2235-2237, Apr. 17, 2000.

Patrick Pilot, et al, Near IR (800-855 nm) sensitive holographic photopolymer dispersed liquid crystal materials, SPIE, vol. 3635, pp. 143-150.

Richard L. Sutherland, Switchable Holograms for displays and other applications, Journal SPIE proc. 3421, pp. 8-18 (1998).

Nicholas Madamopoulos, et al, Polarization selective hologram-based photonic delay lines, Optics Communications 157 (1998) pp. 225-237.

L. Domash, et al, Electronically switchable Bragg gratings for large scale NXN fiber optic crossconnects, SPIE, vol. 3010, pp. 214-228, 1997.

Shiro Umeuchi, et al, Electric field effects on absorption and fluorescence spectra of pyrene doped in a PMMA polymer film, Thin Solid Films 311 (1997), pp. 239-245.

I.C. Khoo, Hologrphic grating formation in dye- and fullerene $C_{60}$-doped nematic liquid-crystal film, Optics Letters, vol. 20, No. 20, Oct. 15, 1995.

L.V. Natarajan, et al, Holographic PDLCs for optical beam modulation, deflection, and dynamic filter applications, SPIE, Voo. 3292, pp. 44-51.

Bob L. Epling, et al, Switchable Holograms for Automotive Apploications, Science Applications International Corp., pp. 205-208.

Gregory P. Crawford, Reflective Liquid Crystal Displays: The Next Major Paradigm Shift in Display Technology, IS & T's 50th Annual Conference, vol. 50, May 1997, pp. 722-723.

T.W. Stone, et al, Switched grating devices for phased array applications, SPIE, vol. 2844, 1996, pp. 182-.

Michelle S. Malcuit, et al, Optically switched volume holographic elements, Optics Letters, vol. 20, No. 11, Jun. 1, 1995.

Jun Qi et al, "Nonlocal Photopolymerization Effect in the Formation of Reflective Holographic Polymer-dispersed Liquid Crystal", J. Appl. Phys. 96, 2442 (2004).

J. A. Jenney, "Holographic Recording with Photopolymers", Opt. Soc. Am., 60 1155 (1970).

* cited by examiner

FIG. 7A
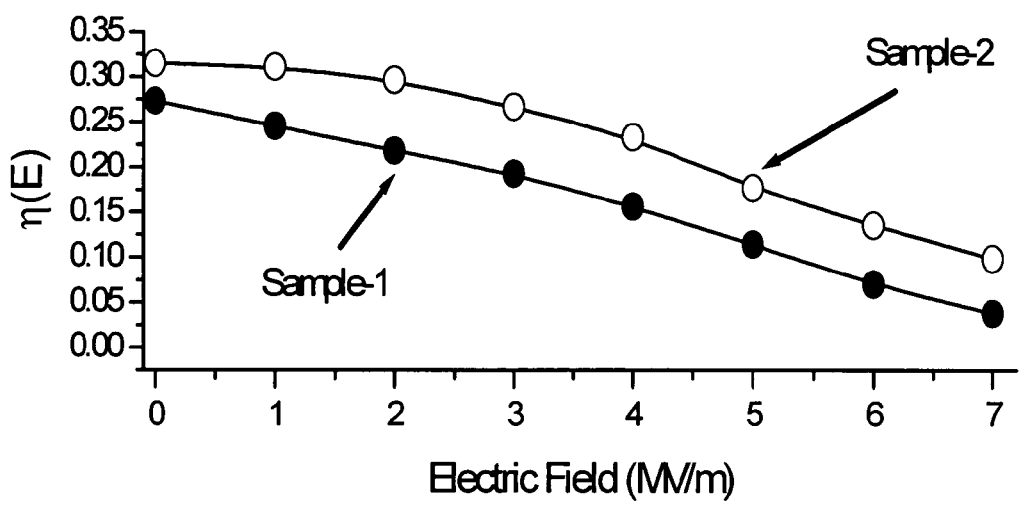
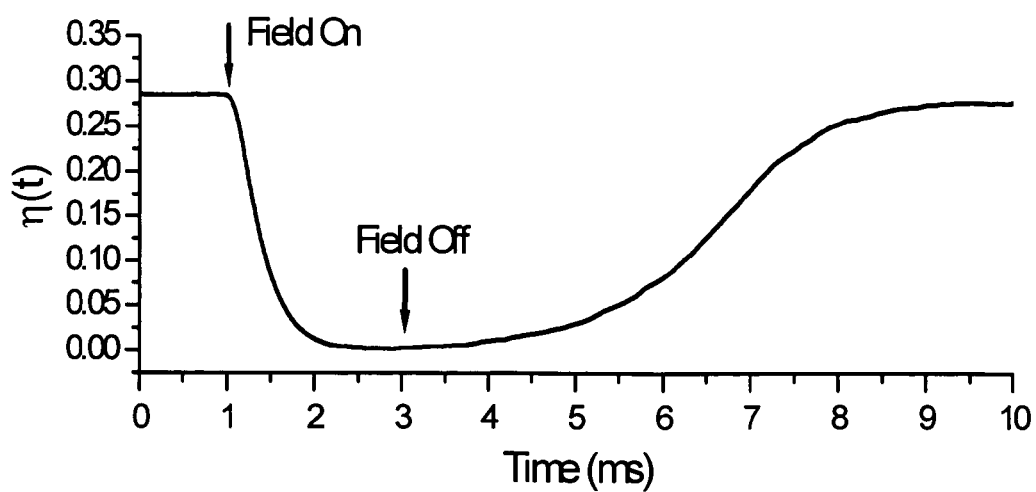
FIG. 7B

SWITCHABLE HOLOGRAPHIC GRATINGS

BACKGROUND OF THE INVENTION

The present invention relates to the field of diffraction gratings, and more specifically to switchable holographic gratings formed from materials comprising polymer-dispersed liquid crystal cells.

Diffraction gratings are widely used in optics and optical instruments to separate light of different wavelengths with high resolution. Diffraction gratings create monochromatic light from a source of white light, which is realized because of the grating's ability to spread light of different wavelengths into different angles. Through application of an electric field that modifies the characteristics of the grating, diffraction gratings may be switchable.

Holographic gratings have generally been formed by an interference fringe field of two laser beams whose standing wave pattern is exposed to a polished substrate coated with a photo resist. Processing of the exposed medium results in a pattern of straight lines with a sinusoidal cross section. Because holographic gratings produce less stray light than ruled gratings, they are often preferred. Holographic gratings can also be produced with up to 3600 grooves per millimeter for greater theoretical resolving power.

Polymer-dispersed liquid crystals (PDLCs) are composite materials consisting of a dispersion of sub-micron size droplets of nematic liquid crystal (LC) in a polymer matrix. They are well-known to exhibit switchable optical properties; optical transmission through the PDLCs can be varied between almost zero and 100% by applying electric fields. Recently it has been demonstrated that the optical properties of the PDLCs can be altered significantly by exposure to nuclear gamma radiation as well as, ultraviolet radiation (the Electrochromic efffect). The holographic polymer-dispersed liquid crystal (H-PDLC) cell provides a unique combination of a suitable material and physical mechanism, whereby a permanent hologram can be imprinted and its diffraction efficiency modulated by an applied electric field.

Currently, holographic gratings are written by using relatively expensive and high energy light sources, e.g. green light from an argon-ion laser or UV sources. As such, there remains a need to fabricate holographic gratings more economically and with more efficiency to enable its use for a broader set of applications.

SUMMARY OF THE INVENTION

The present invention solves certain problems associated with fabricating holographic gratings. Highly economical lasers, such low energy lasers (e.g., helium neon (He—Ne) laser, semiconducting diode laser) are used to efficiently fabricate switchable holographic gratings in materials, such as polymer-based composite materials. The abundance and low cost of He—Ne lasers and red diode lasers makes recording an H-PDLC grating of the present invention highly economical.

Generally, and in one form, the present invention provides for the formation of a switchable holographic grating in a material, such as a polymer-dispersed liquid crystal cell, by using a low energy laser. In one example, a 633 nm wavelength of the He—Ne laser is used.

In another form, the present invention provides for a method comprising the steps of preparing a composite mixture comprising a polymerizable matrix, a liquid crystal, and a photo-oxidant dye, producing an interference pattern from two interference beams, wherein the two interference beams originate from a recording laser beam directed by a low energy laser, and projecting the interference pattern on the composite mixture to form a holographic grating structure. As described, the holographic grating structure yields a first-order diffraction efficiency of at least about 30% diffraction efficiency which may be adjusted by the application of an electric field.

In yet another form, the present invention includes a system for fabricating a holographic grating structure comprising a helium-neon laser directing a low energy beam, a beam expander that expands and recollimates the low energy beam, a beam splitter that splits the low energy beam thereafter recombined to form an interference pattern; and a polymer-dispersed liquid crystal cell to receive the interference pattern while curing, thereby forming a holographic grating structure, wherein the polymer-dispersed liquid crystal cell comprises a polymerizable matrix, a liquid crystal and a photo-oxidant dye. The polymerizable matrix may be a monofunctional acrylic oligomer that is hydroxyl-terminated, the liquid crystal may be E8, and the photo-oxidant dye may be Methylene Blue.

In still another form, the present invention is a holographic grating structure comprising a holographic polymer-dispersed liquid crystal cell suited to receive diffraction gratings with a diffraction efficiency greater than 30%, wherein the diffraction gratings are fabricated by a low energy laser beam. The diffraction efficiency may be adjusted by the application of an electric field and removal of the electric field readjusts the diffraction efficiency.

The present invention is also a holographic structure suitable for receiving a grating comprising a polymerizable matrix comprising a monofunctional acrylic oligomer with functionality slightly larger than 1, wherein the oligomer is hydroxyl-terminated, a liquid crystal, a tetrafunctional cross-linker, and a photoredox-catalysis mixture comprising a photo-oxidant dye. Holographic illumination of the holographic structure results in the periodic phase separation of discrete domains of the liquid crystal.

Applications of the present invention include their use in information and video displays, as switchable focus lenses, as electro-optic filters, with photonic time-delay generators for optically-assisted phased array radar, as optical switches for optical fiber coupling and optical interconnects, as guided-wave switches for wavelength division multiplexing, for electrically addressable security holograms in credit cards, and with automotive lighting distribution systems, as examples. The present invention may be used in any industry engaged in the development and manufacturing of diffraction gratings (e.g., telecommunications, optics, acoustics, astronomy, space and science exploration, automotives, defense, homeland security, as examples).

Those skilled in the art will further appreciate the above-noted features and advantages of the invention together with other important aspects thereof upon reading the detailed description that follows in conjunction with the drawings.

BRIEF DESCRIPTION OF THE DRAWINGS

For more complete understanding of the features and advantages of the present invention, reference is now made to the detailed description of the invention along with the accompanying figures, wherein:

FIGS. 7A and 7B depict the electric field dependence of diffraction efficiency for several H-PDLC samples of the present invention.

DETAILED DESCRIPTION OF THE INVENTION

Figure 1:
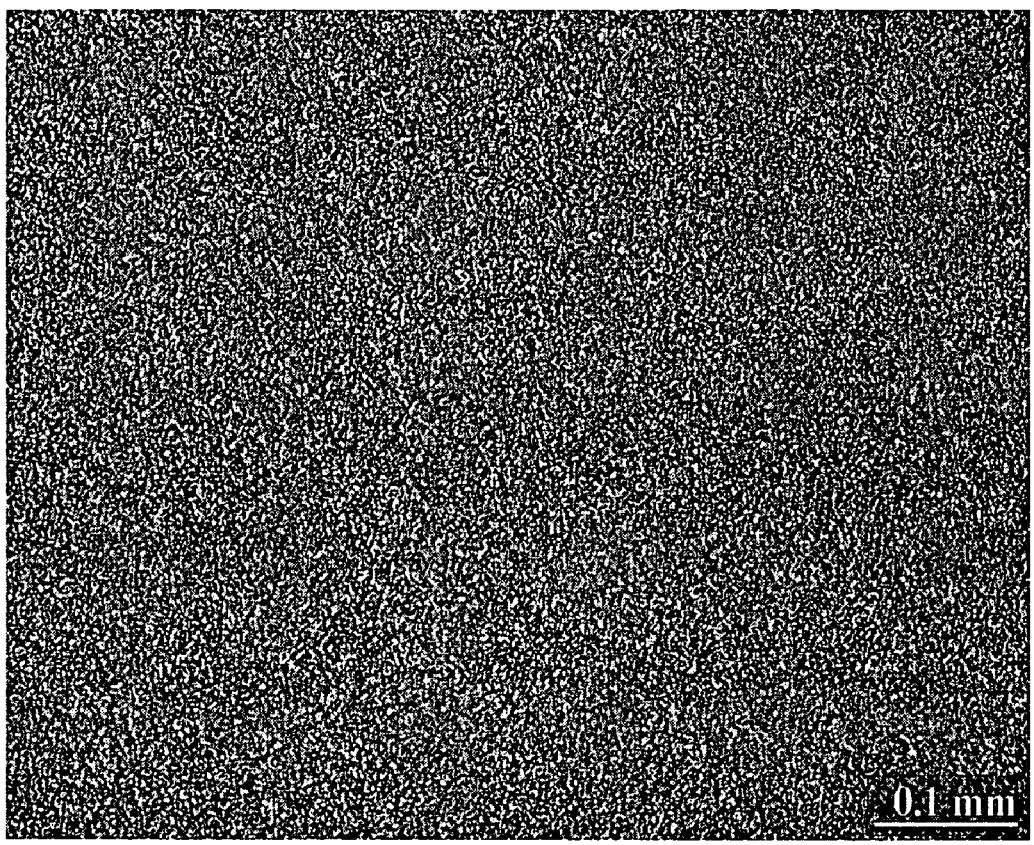
FIG. 1 depicts an optical micrograph of typical PDLC cell, viewed with cross-polarizers in accordance with one aspect of the present invention.

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

It is well-known in the art that certain optical properties of materials (e.g., refractive index and coefficient of absorption) are modulated spatially in the interference region of two light beams. Lasers are ideally suited to generate grating-like structures with custom-designed specifications because of their unique properties of coherence, collimation, and intensity. Additionally, the wavelength tunability and short-pulse capability of lasers permit investigations of particular types of interactions of light with matter. In simple terms, current methods of producing a laser-induced grating require different means for writing the grating than reading the grating. Gratings are generally produced when light from a pump laser is split into two beams A and B with wave vectors $k_A$ and $k_B$, electric field amplitudes $A_A$ and $A_B$, and intensities $I_A$ and $I_B$. The two incident beams intersect at an angle θ at the sample and create an interference pattern, the grating vector q of which is $q=\pm(k_A-k_B)$. The spatial period of the grating is given by $\Lambda=\lambda_p/[2 \sin(\theta/2)]$, where $\lambda_p$ is the wavelength of the incident pump beam. Thus by varying the intersection angle, the grating period Λ can be changed. Obviously, the smallest grating period is achieved when the two excitation beams are antiparallel, giving a minimum value of $\Lambda=\lambda_p/2$. In this discussion, the wave vectors $k_A$ and $k_B$, wavelength $\lambda_P$, and intersection angle θ are measured in the material of refractive index n.

Holographic Polymer-Dispersed Liquid Crystal Material

The present invention uses a polymerizable material to create a holographic polymer-dispersed liquid crystal (H-PDLC) for the fabrication of gratings. Generally, the polymerizable material is a composite mixture comprising a multi-functional monomer, a photosensitizer, and co-initiator. H-PDLCs of the present invention exhibit a relatively high index modulation, true volume hologram character, unique anisotropic nature, and electro-optical properties. As such, the hologram compositions can be formed in a simple, single-step recording in any orientation.

The composite mixture (composition) of the present invention comprises a polymerizable matrix and a liquid crystal (LC), such as E8 or any other available liquid crystal. The polymerizable matrix generally consists of a monomer which is a monofunctional acrylic oligomer with functionality slightly larger than 1 (i.e., low cross-linking capability) and a cross-linker provided at various fractions of the total monomer mass. The holographic composition further comprises a photo-oxidant dye. The photo-oxidant dye helps initiate photopolymerization of the monomer as described below. In one embodiment, the monofunctional acrylic oligomer is CN135. The cross linker may be a tetrafunctional cross linker, such as SR295. The photo-oxidant dye may be Methylene Blue. In some applications, it may be preferable to use oligomer units that are hydroxyl-terminated, thus making them unreactive in crosslinking chemistry during photocuring.

Holographic Polymer-Dispersed Liquid Crystal Synthesis

For the synthesis of the H-PDLC's, the holographic composition (composite mixture comprising polymerizable matrix, liquid crystal and cross-linker) is photopolymerized. Photopolymerization of the monomer is initiated by using a photoredox-catalysis (p-c) mixture. In one embodiment, the mixture comprises a photo-oxidant dye and an acid. Further steps of H-PDLC synthesis follow techniques known to one of ordinary skill and is not fully described herein. The additional steps may use one of the well-known methods in which a phase separation between the liquid crystal and the polymer is induced so as to obtain a dispersion of liquid crystal droplets in a polymer matrix. Such commonly applied methods are polymerization-induced phase separation, thermally-induced phase separation, and solvent-induced phase separation.

The size and distribution of the droplets in the polymer may be controlled by one of several known factors, e.g., concentration of the curing material, curing temperature, viscosity of the polymer, diffusion and solubility of the liquid crystal in the polymer, and the make-up of the starting solution. The droplet size may be further controlled by the rate of polymerization and temperature. A representative optical micrograph, showing an LC droplet dispersion in one of the PDLCs of the present invention is shown in FIG. 1.

In one example, the synthesis of an H-PDLC of the present invention comprised a PDLC mixture of a polymerizable matrix and E8 liquid crystal. The matrix consisted of CN135 (with functionality slightly larger than 1) and the tetrafunctional cross linker, SR295, at various fractions of the total monomer mass. Most of the oligomer units were hydroxyl-terminated. Photopolymerization of the monomer was initiated by using the photo-oxidant dye, Methylene Blue, and p-toluenesulfonic acid.

These samples were prepared by introducing the H-PDLC composite material, via capillary action, between ITO glass plates pre-cured with a pattern made by UV optical adhesive (NOA-65) and spherical ceramic particle spacers (SRI 1124, Sartomer), at about 1% by mass. Here, the average PDLC cell thickness was 10 μm, as determined by cross-section analysis by optical microscopy. Prior to mixing with the monomer and LC, the photoredox-catalysis (p-c) mixture was diluted with de-ionized (DI) water at a ratio of 25 mL of DI water to 1.0 g of Methylene Blue and 0.8 g of p-toluenesulfonic. Sample compositions of two H-PDLCs are shown in the TABLE.

TABLE

Some H-PLDC samples, illustrating concentrations, reported as percent of total mass.

|  | CN135 | SR295 | p-c mixture | E8 |
|---|---|---|---|---|
| Sample-1 | 48% | 25% | 2% | 25% |
| Sample-2 | 45% | 23% | 2% | 30% |

For the present invention, holographic illumination of a polymerizable composition in the form of a syrup containing a monomer and a liquid crystal result in the periodic phase separation of discrete domains of the liquid crystal. Here, the grating structure consists of polymer planes and holes of air with a large periodic refractive index profile in the vertical direction. In this state, there is a random orientation of the director profile within the droplets. When filled with liquid crystal, the amplitude of the refractive index decreases although the average director within a domain is random. When an electric field is applied along the grating vector, all the directors align causing a disappearance (cancellation) of the refractive index profile. Thus one can switch between states (on and off states due to the respective presence or absence of an applied electric field) which provides a means to modulate the diffraction and transmission properties. Through such one-step processing, grating structures can be formed using H-PDLC technology.

Holographic Polymer-Dispersed Liquid Crystal Cell Fabrication

In general, fabrication of a holographic polymer-dispersed liquid crystal cell device of the present invention includes sandwiching a composite mixture (also referred to as syrup) between two indium-tin-oxide (ITO) coated glass electrodes. The composite mixture comprises of a multi-functional monomer, photosensitizer, and co-initiator, and generally includes other reactive diluents and additives.

For the purpose of forming a grating, a recording laser beam is split into two coherent beams, which are recombined at some angle in the H-PDLC cell to produce an interference pattern. The resulting interference pattern is imprinted in the H-PDLC during the curing process. This produces a periodic spatial variation in the refractive index within the material, thus forming a diffraction grating. With the application of an electric field across the H-PDLC grating, there may be a significant change the orientation of the director of the LC droplets to smooth-out or completely eliminate the spatial variation in the refractive index. Consequently the diffraction grating is erased; light is no longer diffracted and the H-PDLC turns into an ordinary PDLC, whose electro-optical properties are controlled in the usual manner, e.g., by externally applied electric fields.

System for Fabricating a Grating Structure

Figure 2:
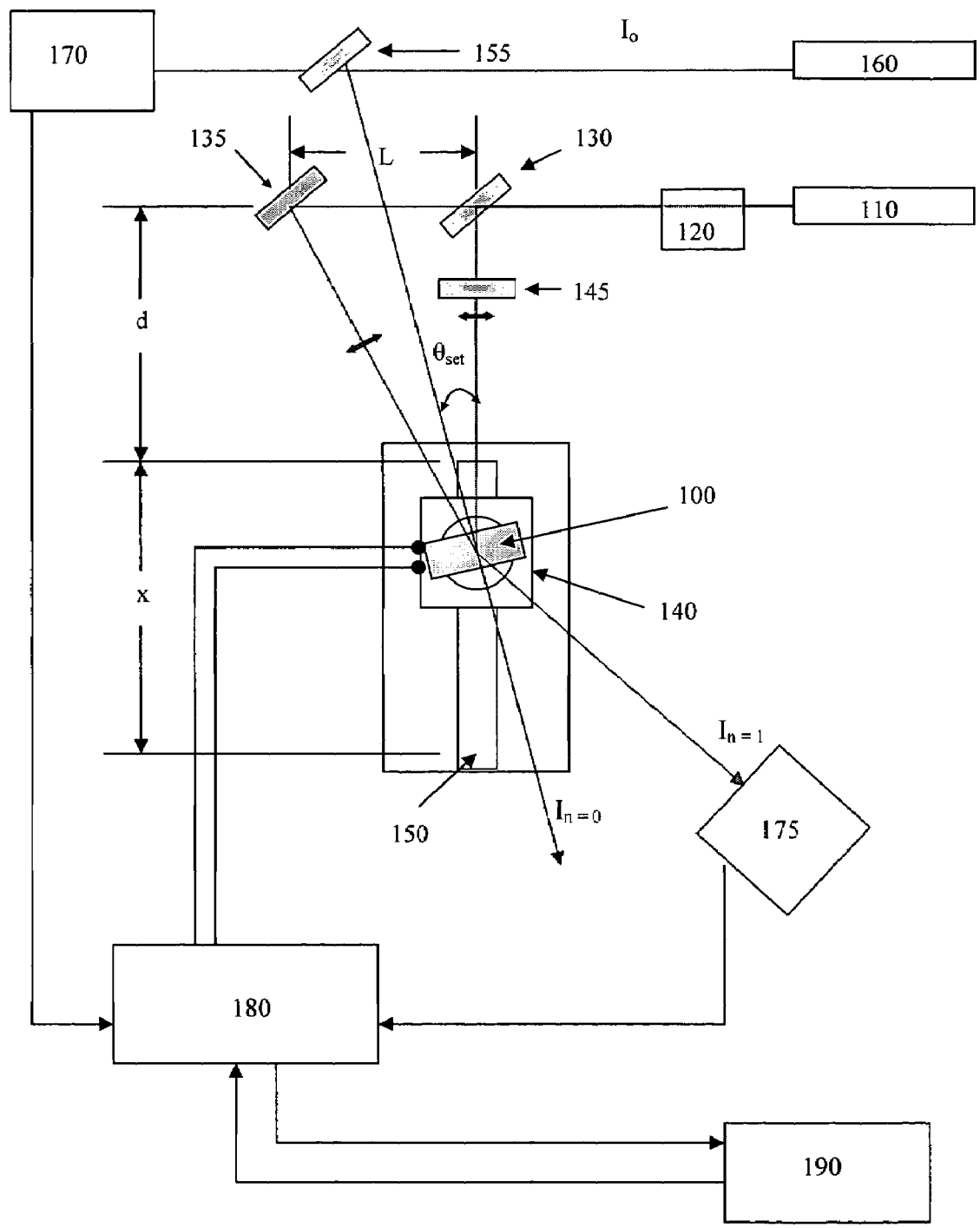
FIG. 2 depicts an optical setup for recording a two-beam H-PDLC in accordance with one aspect of the present invention.

In one example, the formation of H-PDLC gratings were fabricated with a He—Ne laser with λ=633 nm radiation. A schematic of a system of the present invention in which dye-doped H-PDLCs may be fabricated using a low energy source with λ=633 nm radiation provided by an He—Ne laser is shown in FIG. 2.

In this example, a pump beam or recording beam 110 (e.g., 0.8 mW He—Ne laser beam) was expanded and recollimated to a dimension (e.g., 0.5 cm diameter) by a beam expander 120. The recollimated beam was split into two coherent beams by a beam splitter 130 and then directed and recombined at an H-PDLC 100. A mirror 135 may be used to help recombine the split beams at some angle in the H-PLDC 100.

In some instances, the mirror may be a partial transmitting-reflecting mirror. Beam splitting was provided to form an interference pattern. A polarizer 145 was used for one of the interference beams. H-PDLC 100 was mounted on a mount 140 which is preferably a 360 degree mount; an optical railing 150 is included. A probe beam 160 was further directed and split by a beam splitter 155.

In one embodiment, the mount 140 is rotated such that a probe beam 160 enters the H-PDLC 100 along the normal to the H-PDLC 100 surface and simultaneously bisects the angle ($2\theta_{set}$) between the two interference beams. The irradiance of the two interference beams incident at the holographic medium is adjusted to be about equal, with typical exposure irradiance of 0.25 mW/cm².

The optical system of FIG. 2 allowed for the two beams (160 and 110) to interfere at any angle ($2\theta_{set}$), ranging from at least about 1 degree to at least about 30 degrees. The angle $\theta_{set}$ may be given by the following equation (1):

$$\theta_{set} = \frac{1}{2}\tan^{-1}\left(\frac{L}{d+x}\right). \quad (1)$$

The corresponding value of the grating period (Λ) may be related to $\theta_{set}$ according to equation (2) as shown by $$\Lambda = \frac{\lambda_{pump}}{2\sin(\theta_{set})}. \quad (2)$$

Diffraction gratings written with the 633 nm wavelength of the He—Ne laser were characterized with grating periods ranging from at least about 0.63 μm to at least about 18 μm. The diffraction efficiency (η), may be defined by $$\eta = \frac{I_{m=1}}{I_0} \quad (3)$$

and was obtained by measuring the intensity of the incident probe beam ($I_O$) and the intensity of the first-order (m=1) diffraction beam ($I_{m=1}$) using photodiodes 170 and/or 175 (e.g., Si detectors) and an associated electronic module 180, that may include a pre-amplifier, function generator, and/or oscillator.

For determination of the switching characteristics of the gratings, the electronic module 180 was used to apply external electric fields to H-PDLC 100, ranging up to at least about 7 MV/m at about 1.0 kHz. Data was acquired by a data reader/analyzer 190 (e.g., by computer) so that data acquisition and data analysis software could acquire and analyze any or all of the data obtained from the system.

Characteristics of the Polymer-Dispersed Liquid Crystal Gratings

Figure 3:
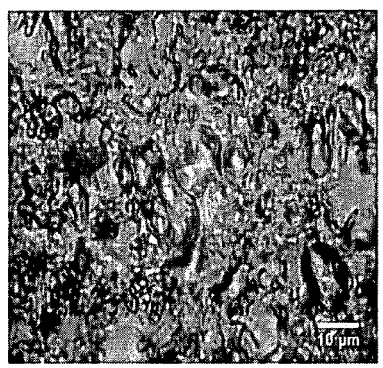
FIG. 3 shows a microstructure view of a PDLC of the present invention.
Figure 4A:
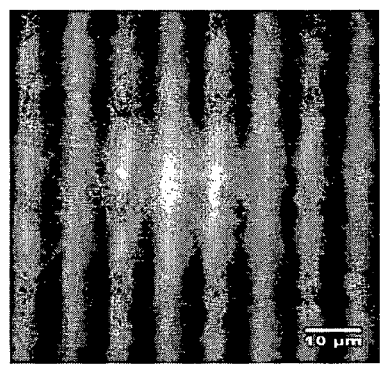
FIGS. 4A and 4B depict typical diffraction patterns and gratings formed in two different H-PDLCs of the present invention with a scale bar of 10 μm.
Figure 4B:
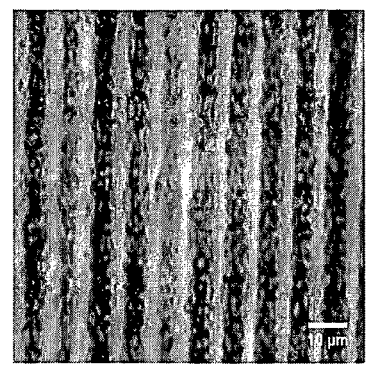
Figure 5:
FIG. 5 depicts an interference pattern of a grating formed by the present invention.

Characteristics of the H-PLDC gratings may be evaluated through means known in the art. Characteristic measurements included time evolutions of the self-diffraction efficiency of the grating and optical microscopy of the grating structure after saturation of the diffraction efficiency (cured gratings). In one example, $\theta_{set}$ was 3.5 degrees and the corresponding Λ was 5.2 μm. The structures of the cured gratings were examined by using 200× Nikon Optiphot microscope. A typical microstructure view of a PDLC of the present invention are show in FIGS. 3 and 4. Typical diffraction gratings are shown in FIGS. 4A and 4B. FIG. 5 shows the characteristic m=0, 1, and 2 interference spots of two H-PDLC cured-gratings.

In FIG. 4, dark regions are typically rich in LC droplets, while brighter regions are typically polymer rich. These results can be understood by considering the chemical potential of the LC and polymer. Polymerization, due to the high rate of free radical production (here resulting from the absorption in Methylene Blue), begins in the high-intensity regions of the interference pattern. The consumption of the monomers in these regions lowers their chemical potential, which in turn gives rise to diffusion of additional monomers from the lower-intensity regions towards the higher-intensity regions. During this process the LC molecules are not consumed by the polymerization process and their chemical potential increases in the high-intensity regions over that in the lower-intensity regions. Hence, there is diffusion of LC molecules from high to low-intensity regions to equalize the chemical potential within the interference pattern.

Figure 6:
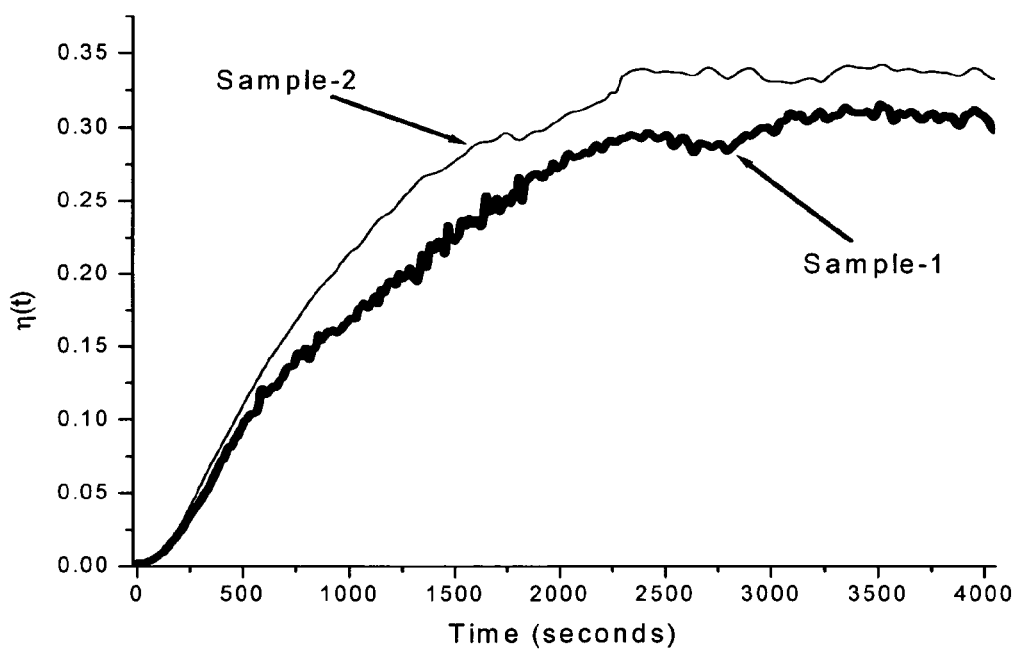
FIG. 6 depicts the time-dependent diffraction efficiency for two different H-PDLCs of the present invention.

The time evolution of the measured first-order (m=1) self-diffraction efficiency, defined by equation (3), for two H-PDLCs of FIG. 6 are shown in FIG. 6. These data typically show three regions that characterize the dynamic growth of the diffraction grating. Initially there is a short induction period (often $\leq 100$ seconds) during which all inhibitors, e.g. oxygen or those supplied by the manufacturer to prevent accidental polymerization, have reacted. Next there is a period (at least about 1500 s) of polymerization and photobleaching of the Methylene Blue with an associated rise in diffraction efficiency. Finally a plateau region occurs within which the polymerization is almost complete and the dye molecules are considered bleached.

The temporal evolution of the gratings, seen in FIG. 6, follows qualitatively the same behavior as described above and for both samples. As shown, $\eta_{max} \approx 30\%$ and 35% for sample-1 and sample-2, respectively. It should be noted that the higher diffraction efficiency observed for sample-2 is consistent with the sharper defined grating structure of this sample as seen in FIG. 4B. The observed rise in the diffraction efficiency with time can be characterized with time constants of about 20 mts and 15 mts for sample-1 and sample-2, respectively.

The switching characteristics of H-PDLCs are due to the effects of externally applied electric fields on the first-order diffraction efficiency. Examples are shown in FIG. 7 in which data for two differently conducted examples are represented. In FIG. 7A, the effect of the rms-amplitude of an about 1-kHz electric field on the diffraction efficiencies of two cured grating is shown. The diffraction efficiencies of both gratings decrease with increasing rms-amplitude of the electric field; the efficiency of sample-2 remaining higher than that of sample-1 over the range of the applied electric fields. A value for the "switch-off" electric field can be estimated to be approximately 10 MV/m from an extrapolation of these data.

In FIG. 7B, the effect of the application of a particular rms-amplitude of the electric field (at least about 7 MV/m @ 1 kHz) on the time constants for the decay and recovery of the grating efficiency is represented. The diffraction efficiency of the grating, prior to the application of the electric field, was about 30%. Under the influence of 7 MV/m @ 1 kHz electric field (from about 1 ms until about 3 ms), the diffraction efficiency decreased in time with a time constant of about 1 ms and reached its lowest value at about 2.5 ms. Once the electric field was removed (at about 3 ms), the diffraction efficiency began to recover and approached its initial value of about 30% at about 8 ms. The recovery was characterized with a relaxation time constant of about 4 ms.

The differences in the switching characteristics of the two gratings of FIG. 7A may, in part, be due to effects related to H-PDLC morphology and/or LC-polymer interfacial effects. When the LC droplet size distributions in these samples were compared, it was found that sample-1 contained much larger LC droplets (average droplet sizes in sample-1 was approximately 1.0 micrometer and the average droplet sizes in sample-2 was $\leq 0.25$ μm).

The above observations are consistent with previously published results that the critical value for the switching electric field for a PDLC decreases with an increase in the size of the spherical LC droplets.

As shown herein, the present invention realizes the production and fabrication of switchable H-PDLC gratings capably of being written or fabricated as well as read with the same laser comprising a highly economical and low energy laser. With the method, device and system of the present invention, well-defined periodic grating structures were fabricated. The grating structures were characterized by a grating period, $\Lambda$, of at least about 5.2 μm and maximum value of the first-order diffraction efficiency, $\eta_{max}$, of at least about 35%. By application of an externally applied ac electric field, the H-PDLC gratings were found to be switchable.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed:

1. A method for fabricating a holographic grating structure comprising the steps of:
    preparing a composite mixture comprising
        a polymerizable matrix comprising
            a functional acrylic oligomer with a monofunctionality or functionality slightly larger than 1, wherein the oligomer is a low viscosity aromatic oligomer provided at about 45% to 48% of the composite mixture based on total mass; and
            a tetrafunctional crosslinker,
        a nematic liquid crystal that is about 25% to 30% of the composite mixture based on total mass, and
        a pre-mixed photo-redox catalysis mixture for a low energy laser comprising a photo-oxidant dye and an acid, wherein the photo-redox catalysis mixture is about 2% of the composite mixture based on total mass;
    producing an interference pattern from two interference beams, wherein the two interference beams originate from a recording laser beam directed by a the low energy laser; and
    projecting the interference pattern on the composite mixture to form a holographic grating structure.

2. The method of claim 1, wherein the oligomer is hydroxyl-terminated.

3. The method of claim 1, wherein the oligomer has a low cross-linking capability.

4. The method of claim 1, wherein the low energy laser is selected from the group consisting of a helium-neon laser and a diode laser.

5. The method of claim 1, wherein the recording laser beam is used to read the holographic grating structure.

6. The method of claim 1, wherein the photo-oxidant dye is Methylene Blue.

7. The method of claim 1, wherein the holographic grating structure yields a first-order diffraction efficiency of at least about 30%.

8. The method of claim 7, wherein the diffraction efficiency is adjusted by the application of an electric field.

9. The method of claim 1, wherein data about the holographic grating structure is acquired by a data reader and data analyzer.

10. The method of claim 1, wherein the acid is p-toluenesulfonic acid.

11. A system for fabricating a holographic grating structure comprising:
   a low energy recording laser directing a low energy beam;
   a beam expander that expands and recollimates the low energy beam;
   a beam splitter that splits the low energy beam thereafter recombined to form an interference pattern; and
   a polymer-dispersed liquid crystal cell to receive the interference pattern while curing, thereby forming a holographic grating structure, wherein the polymer-dispersed liquid crystal cell is a composite mixture of a polymerizable matrix that includes a functional acrylic oligomer with a monofunctionality or functionality slightly larger than 1 and a tetrafunctional crosslinker, wherein the oligomer is a low viscosity aromatic oligomer provided at about 45% to 48% of the composite mixture based on total mass, a liquid crystal that is nematic liquid crystal that is about 25% to 30% of the composite mixture based on total mass, and a pre-mixed photo-redox catalysis mixture for the low energy beam comprising a photo-oxidant dye and an acid, wherein the photo-redox catalysis mixture is about 2% of the composite mixture based on total mass.

12. The system of claim 11, wherein the polymerizable matrix is about 68% to 73% of the composite mixture based on total mass.

13. The system of claim 12, wherein the oligomer has a low cross-linking capability.

14. The system of claim 11, wherein the low energy recording laser is selected from the group consisting of a helium-neon laser and a diode laser.

15. The system of claim 11, wherein the low energy beam is used to read the holographic grating structure.

16. The system of claim 11, wherein the holographic grating structure yields a first-order diffraction efficiency of at least about 30%.

17. The system of claim 16, wherein the diffraction efficiency is adjusted by the application of an electric field.

18. The system of claim 11, wherein data about the holographic grating structure is acquired by a data reader and data analyzer.

19. The system of claim 11, wherein the acid is p-toluenesulfonic acid.

20. A holographic grating structure comprising:
   a holographic polymer-dispersed liquid crystal cell suited to receive diffraction gratings with a diffraction efficiency greater than 30%, wherein the diffraction gratings are fabricated by a low energy laser beam, wherein the polymer-dispersed liquid crystal cell is a composite mixture of a polymerizable matrix that includes a functional acrylic oligomer with a monofunctionality or functionality slightly larger than 1 and a tetrafunctional crosslinker, wherein the oligomer is a low viscosity aromatic oligomer provided at about 45% to 48% of the composite mixture based on total mass, a liquid crystal that is nematic liquid crystal that is about 25% to 30% of the composite mixture based on total mass, and a pre-mixed photo-redox catalysis mixture for the low energy laser beam comprising a photo-oxidant dye and an acid.

21. The holographic grating structure of claim 20, wherein the diffraction efficiency is adjusted by application of an electric field.

22. The holographic grating structure of claim 21, wherein removal of the electric field readjusts the diffraction efficiency.

23. The holographic grating structure of claim 20, wherein the polymerizable matrix is about 68% to 73% of the composite mixture based on total mass, the oligomer has a low cross-linking capability and the photo-redox catalysis mixture is about 2% of the composite mixture based on total mass.

24. The holographic grating structure of claim 20, wherein the acid is p-toluenesulfonic acid.

25. A system for fabricating a holographic grating structure comprising:
   a helium-neon laser directing a low energy beam;
   a beam expander that expands and recollimates the low energy beam;
   a beam splitter that splits the low energy beam thereafter recombined to form an interference pattern; and
   a polymer-dispersed liquid crystal cell to receive the interference pattern while curing, thereby forming a holographic grating structure, wherein the polymer-dispersed liquid crystal cell is a composite mixture of a polymerizable matrix that includes a functional acrylic oligomer with a monofunctionality or functionality slightly larger than 1 and a tetrafunctional crosslinker wherein the oligomer is a low viscosity aromatic oligomer provided at about 45% to 48% of the composite mixture based on total mass, a liquid crystal that is nematic liquid crystal that is about 25% to 30% of the composite mixture based on total mass and a pre-mixed photo-redox-catalysis mixture for the low energy beam comprising a photo oxidant dye and an acid.

26. The system of claim 25, wherein the polymerizable matrix is about 68% to 73% of the composite mixture based on total mass.

27. The system of claim 25, wherein the oligomer has a low cross-linking capability.

28. The system of claim 25, wherein the photo-redox catalysis mixture is about 2% of the composite mixture based on total mass.

29. The system of claim 25, wherein the holographic grating structure yields a first-order diffraction efficiency of at least about 30%.

30. The system of claim 29, wherein the diffraction efficiency is adjusted by the application of an electric field.

31. A holographic structure suitable for receiving a grating comprising:
   a polymerizable matrix further comprising a functional acrylic oligomer with a monofunctionality of functionally slightly larger than 1 and a tetrafunctional crosslinker, wherein the oligomer is hydroxyl-terminated and is a low viscosity aromatic oligomer provided at about 45% to 48% of the composite mixture based on total mass;
   a liquid crystal that is nematic liquid crystal that is about 25% to 30% of the composite mixture based on total mass; and
   a pre-mixed photoredox-catalysis mixture comprising a photo-oxidant dye of methylene blue and p-toluenesulfonic acid.

32. The system of claim 31, wherein the oligomer has a low cross-linking capability.

33. The holographic structure of claim 31, wherein the photoredox-catalysis mixture is about 2% of the composite mixture based on total mass.

34. The holographic structure of claim 31, wherein the tetrafunctional cross-linker is a pentaerythritol tetraacrylate provided at about 25% of the composite mixture based on total mass.

35. The holographic structure of claim 31, wherein holographic illumination of the holographic structure results in the periodic phase separation of discrete domains of the liquid crystal.

36. A system for fabricating a holographic grating structure comprising:
- a low energy recording laser directing a low energy beam;
- a beam expander that expands and recollimates the low energy beam;
- a beam splitter that splits the low energy beam thereafter recombined to form an interference pattern; and
- a polymer-dispersed liquid crystal cell to receive the interference pattern while curing, thereby forming a holographic grating structure, wherein the polymer-dispersed liquid crystal cell is a composite mixture of a polymerizable matrix that includes a functional acrylic oligomer with a monofunctionality or functionality slightly larger than 1 and a tetrafunctional crosslinker, wherein the oligomer is a low viscosity aromatic oligomer provided at about 45% to 48% of the composite mixture based on total mass, a liquid crystal that is nematic liquid crystal that is about 25% to 30% of the composite mixture based on total mass, and a pre-mixed photo-redox-catalysis mixture for the low energy beam comprising a photooxidant dye methylene blue and p-toluenesulfonic acid.

37. The system of claim 36, wherein the polymerizable matrix is about 68% to 73% of the composite mixture based on total mass.

38. The system of claim 36, wherein the oligomer has a low cross-linking capability.

39. The system of claim 36, wherein the photo-redox catalysis mixture is about 2% of the composite mixture based on total mass.

40. The system of claim 36, wherein the holographic grating structure yields a first-order diffraction efficiency of at least about 30%.

41. The system of claim 40, wherein the diffraction efficiency is adjusted by the application of an electric field.

* * * * *

UNITED STATES PATENT AND TRADEMARK OFFICE
CERTIFICATE OF CORRECTION

| | | |
|---|---|---|
| PATENT NO. | : 7,625,674 B2 | |
| APPLICATION NO. | : 10/958669 | |
| DATED | : December 1, 2009 | |
| INVENTOR(S) | : Suresh C. Sharma and Robert A. Ramsey | |

It is certified that error appears in the above-identified patent and that said Letters Patent is hereby corrected as shown below:

Col. 3, line 51
Replace "Thus by varying" with --Thus, by varying--

Col. 4, line 30
Replace "and is not fully described" with --and are not fully described--

Col. 6, lines 66-67
Replace "invention are show in" with --invention is shown in--

Col. 8, line 52
Replace "by a the low energy" with --by a low energy--

Signed and Sealed this
Ninth Day of August, 2011

David J. Kappos
*Director of the United States Patent and Trademark Office*